United States Patent
Hayashi

(10) Patent No.: US 10,431,539 B2
(45) Date of Patent: Oct. 1, 2019

(54) SEMICONDUCTOR INTEGRATED CIRCUIT INCLUDING DISCHARGE CONTROL CIRCUIT

(71) Applicant: KABUSHIKI KAISHA TOSHIBA, Tokyo (JP)

(72) Inventor: Tsuneyuki Hayashi, Kodaira Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/686,904

(22) Filed: Aug. 25, 2017

(65) Prior Publication Data

US 2018/0226335 A1 Aug. 9, 2018

(30) Foreign Application Priority Data

Feb. 9, 2017 (JP) .................................. 2017-022496

(51) Int. Cl.
    *H01L 23/50* (2006.01)
    *G05F 1/00* (2006.01)
    *H01L 27/118* (2006.01)

(52) U.S. Cl.
    CPC ............... *H01L 23/50* (2013.01); *G05F 1/00* (2013.01); *H01L 2027/11881* (2013.01); *H01L 2924/14* (2013.01)

(58) Field of Classification Search
    CPC ..................................................... H01L 23/50
    USPC ....................................................... 257/499
    See application file for complete search history.

(56) References Cited

U.S. PATENT DOCUMENTS

| 9,209,737 B2 | 12/2015 | Funaba et al. | |
|---|---|---|---|
| 2006/0034142 A1* | 2/2006 | Ooishi | G11C 8/10 365/230.06 |
| 2007/0262764 A1* | 11/2007 | Warita | H02M 3/00 323/284 |
| 2012/0074986 A1* | 3/2012 | Nakamura | H03K 4/501 327/102 |
| 2018/0226335 A1* | 8/2018 | Hayashi | G05F 1/00 |

FOREIGN PATENT DOCUMENTS

| JP | 2010130743 A | 6/2010 |
|---|---|---|
| JP | 2016046620 A | 4/2016 |

* cited by examiner

*Primary Examiner* — Jami Valentine Miller
(74) *Attorney, Agent, or Firm* — Kim & Stewart LLP

(57) ABSTRACT

A semiconductor integrated circuit includes an output circuit connected between a power supply and a node at which a load can be connected. The output circuit electrically connects and disconnects the power supply to/from the node according to a logic level of a first signal. A discharge circuit is connected between the node and a reference potential. The discharge circuit disconnects the node from the reference potential when a second signal supplied to the discharge circuit is a first level and connects the node to the reference potential when the second control signal is a second level. A discharge control circuit sets the second signal to the second level when the first signal changes to the second level from first level and then sets the second signal to the first level after a predetermined time has elapsed from a time when the first signal changes to the second level.

12 Claims, 9 Drawing Sheets

SEMICONDUCTOR INTEGRATED CIRCUIT INCLUDING DISCHARGE CONTROL CIRCUIT

CROSS-REFERENCE TO RELATED APPLICATION

This application is based upon and claims the benefit of priority from Japanese Patent Application No. 2017-022496, filed Feb. 9, 2017, the entire contents of which are incorporated herein by reference.

FIELD

Embodiments described herein relate generally to a semiconductor integrated circuit.

BACKGROUND

A power supply regulator, such as an LDO (Low Drop Out) regulator, and a power supply switch, such as a load switch, are each used as a power supply circuit for supplying electric power to a load, such as an electrical instrument. Each of these power supply circuits includes a discharge circuit for discharging the load (i.e., removing electric charge accumulated in the load) when the supply of the power to the load is stopped. When switching into a discharging state, a conventional discharge circuit will maintain the discharging state even after the load discharging has been completed. Because of this, an unintended high current (also referred to as "short-circuit current") flows between the load and a ground via the discharge circuit, and this flow often causes the load to breakdown.

DETAILED DESCRIPTION

In general, according to one embodiment, an output circuit is connected between a power supply and a first node at which a load component can be connected. The output circuit electrically connects the power supply to the first node when a first control signal supplied to the output circuit is a first logic level and electrically disconnects the power supply from the first node when the first control signal is a second logic level. A discharge circuit is connected between the first node and a reference potential source. The discharge circuit electrically disconnects the first node from the reference potential source when a second control signal supplied to the discharge circuit is the first logic level and electrically connects the first node to the reference potential source when the second control signal is the second logic level. A discharge control circuit is configured to set the second control signal to the second logic level when the first control signal changes to the second logic level from the first logic level and to set the second control signal to the first logic level after a predetermined time has elapsed from a time when the first control signal changes to the second logic level.

Example embodiments according to the present disclosure will be described hereinafter with reference to the drawings. The example embodiments are not intended to limit the present disclosure.

(First Embodiment)

Figure 1:
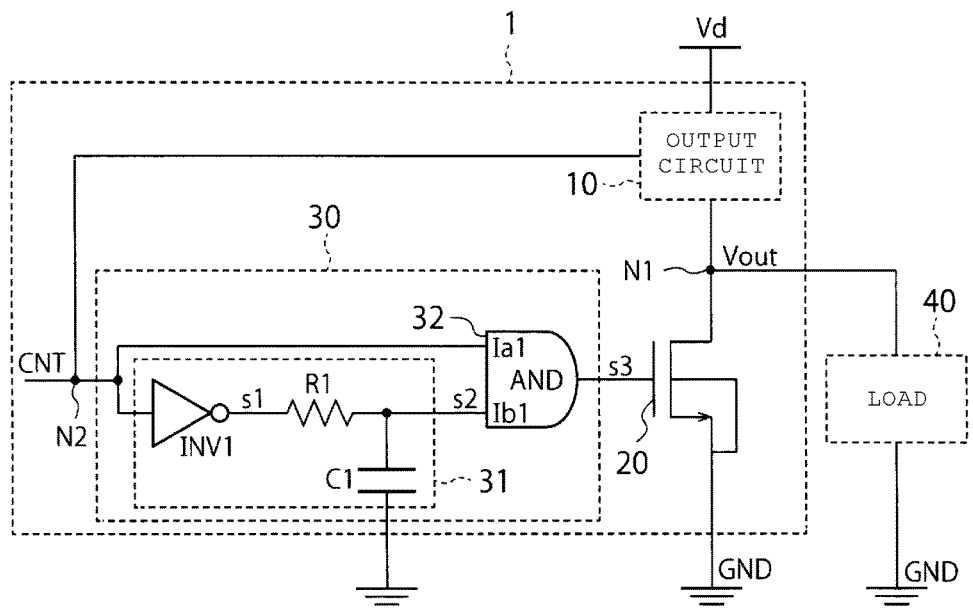
FIG. 1 is a block diagram illustrating an example of a power supply circuit according to a first embodiment.
Figure 2A:
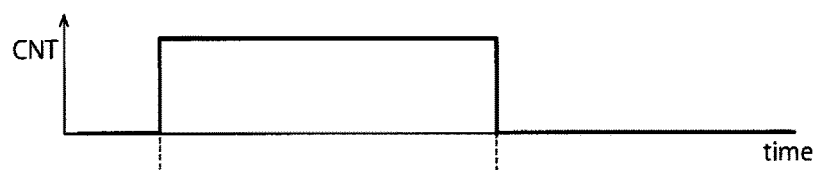
FIGS. 2A to 2D are graphs illustrating an example of an operation performed by the power supply circuit according to the first embodiment.
Figure 2B:
Figure 2C:
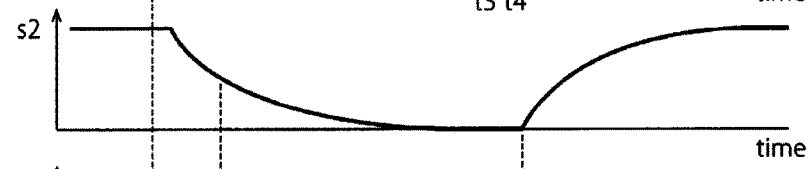
Figure 2D:

FIG. 1 is a block diagram illustrating an example of a power supply circuit 1 according to a first embodiment. The power supply circuit 1 is a semiconductor integrated circuit that supplies power from a power supply Vd to a load 40 in response to a first control signal CNT or that stops supplying the electric power thereto. The power supply circuit 1 includes an output circuit 10, a discharge circuit 20, and a discharge control circuit 30. While the power supply circuit 1 is preferably one semiconductor chip, the power supply circuit 1 may be a module with a plurality of semiconductor chips.

The output circuit 10 is provided between a power supply Vd and the load 40 and switches on or off supply of the power from the power supply Vd to the load 40. For example, when the first control signal CNT is a first logic state (e.g., a logical low value), the output circuit 10 electrically connects the power supply Vd to the load 40. The output circuit 10 thereby supplies the power from the power supply Vd to the load 40 as an output voltage Vout. On the other hand, when the first control signal CNT is a second logic state (e.g., logical high value), the output circuit 10 electrically disconnects the power supply Vd from the load 40. The output circuit 10 thereby stops supplying the power from the power supply Vd to the load 40. An internal configuration of the output circuit 10 is not limited as long as the output circuit 10 can switch on or off the supply of the power from the power supply Vd. While the first and second logic states are respectively described as being a logical low value and a logical high value, in the present example, it generally suffices that one of the first and second logic states is a logical high value and the other is logical low value, as such the first logic state may correspond to a logical high value and the second logic state may correspond to a logical low value in some embodiments.

The discharge circuit 20 is connected between a first node N1, which is between the load 40 and the output circuit 10, and a ground GND serving as a reference potential source. While an internal configuration of the discharge circuit 20 is not limited, the discharge circuit 20 in this example is configured with an N-type MIS (Metal Insulator Semiconductor) transistor and the like. When a control signal s3, serving as a second control signal, is logical low, the discharge circuit 20 electrically disconnects the first node N1 from the ground GND. At this time, the output circuit 10 is in an ON-state and can supply the power from the power supply Vd to the load 40. On the other hand, when the control signal s3 is logical high, the discharge circuit 20 electrically connects the first node N1 to the ground GND. The discharge circuit 20 thereby discharges the load 40, that is, removes electric charge accumulated in the load 40. At this time, therefore, the output circuit 10 is in an OFF-state and does not supply power from the power supply Vd to the load 40.

The discharge control circuit 30 is connected to the discharge circuit 20 and outputs a control signal s3 for controlling the discharge circuit 20. For example, the discharge control circuit 30 is connected to a gate electrode of discharge circuit 20 and outputs the control signal s3 to the gate electrode. The discharge control circuit 30 includes a delay circuit 31 and a logic circuit 32 for generating the second control signal s3 from the first control signal CNT.

The delay circuit 31 includes an inverter circuit INV1, a resistance element R1, and a capacitor element C1. The inverter circuit INV1 and the resistance element R1 are connected in series between an input node N2, at which the control signal CNT is input, and an input terminal Ib1 of the logic circuit 32. The capacitor element C1 is connected between the input terminal Ib1 and the ground GND. The inverter circuit INV1 inverts the control signal CNT and outputs the inverted control signal as a signal s1. The resistance element R1 and the capacitor element C1 constitute an RC delay circuit that delays the signal s1 from the inverter circuit INV1 by predetermined time, and then outputs the delayed signal as a delay signal s2. That is, the delay circuit 31 receives the input control signal CNT, then delays the signal s1 relative to control signal CNT by a predetermined time, and thereby provides the delay signal s2. The delay time of the delay signal s2 relative to the control signal CNT is determined by an RC time constant of the resistance element R1 and the capacitor element C1. The delay circuit 31 outputs the delay signal s2 to the input signal terminal Ib1 of the logic circuit 32.

The logic circuit 32 is, for example, an AND gate that performs an AND operation. One input terminal Ia1 of the logic circuit 32 receives the input control signal CNT while the other input terminal Ib1 receives the delay signal s2 from the discharge control circuit 30. The logic circuit 32 performs a logical operation on the control signal CNT and the delay signal s2 and outputs a logical operation result as control signal s3. For example, the logic circuit 32 outputs the control signal s3 as a logical AND operation on the inputs of the control signal CNT and the delay signal s2. The control signal s3 is used for a switching control for the discharge circuit 20 (that is, control signal s3 exerts an ON/OFF control over the discharge circuit 20).

When the control signal CNT is a logical low value, the logic circuit 32 sets the control signal s3 to be a logical low value. Therefore, while the output circuit 10 supplies the power to the load 40, the discharge control circuit 30 turns off the discharge circuit 20, so that the discharge circuit 20 electrically disconnects the load 40 from the ground GND. That is, the discharge circuit 20 stops discharging the load 40 to ground GND.

When the control signal CNT is inverted, the logic of the control signal CNT is delayed by the delay circuit 31 and transferred to the delay signal s2. As a result, right after the control signal CNT becomes a logical high value, the delay signal s2 is maintained at a logical high value until the delay time elapses. The logic circuit 32 thereby sets the control signal s3 to be a logical high value. When the control signal s3 is set to be the logical high value, the discharge control circuit 30 turns on the discharge circuit 20, so that the discharge circuit 20 electrically connects the load 40 to the ground GND. That is, right after the output circuit 10 stops supplying the power to the load 40, the discharge circuit 20 executes a discharging operation.

When the delay time elapses after the control signal CNT becomes logical high, the logic of the control signal CNT is transferred to the delay signal s2 via the delay circuit 31. Therefore, after passage of the delay time since the control signal CNT switched to logical high, the delay circuit 31 inverts the delay signal s2 to be logical low. The logic circuit 32 thereby returns the control signal s3 to logical low. When the control signal s3 is logical low, the discharge control circuit 30 turns off the discharge circuit 20, so that the discharge circuit 20 electrically disconnects the load 40 from the ground GND. That is, once the delay time elapses after the output circuit 10 stops supplying the power to the load 40, the discharge control circuit 30 returns the discharge circuit 20 back into the OFF-state, so that the discharge circuit 20 stops the discharging operation.

In this way, the power supply circuit 1 discharges the load 40 for the delay time after the output circuit 10 stops supplying the power to the load 40 and then stops discharging the load 40 after the delay time elapses. The power supply circuit 1 thereby discharges the load 40 for a set period of time and then stops discharging the load 40 after the set period of time ends. The power supply circuit 1 can thereby prevent the discharging of the load 40 from continuing excessively and suppress breakdown of the load 40 that might be caused by a current flowing through the discharge circuit 20.

An operation performed by the power supply circuit 1 according to the first embodiment will next be described.

FIGS. 2A to 2D are graphs illustrating an example of the operation performed by the power supply circuit 1 according to the first embodiment. FIGS. 2A to 2D illustrate changes of the control signal CNT, the signal s1, the delay signal s2, and the second control signal s3, respectively. In each graph, the vertical axis represents a logical signal value (that is, a signal voltage level) of each of the signals CNT and s1 to s3, and the horizontal axis represents time.

First, prior to t1, the control signal CNT is logical low and the output circuit 10 supplies the power from the power supply Vd to the load 40. At this time, the signals s1 and s2 are logical high; however, since the control signal CNT is logical low, the logic circuit 32 outputs the control signal s3 as logical low. Therefore, the discharge circuit 20 is in an OFF-state and the load 40 is electrically disconnected from the ground GND.

At t1, the control signal CNT becomes logical high, thus the output circuit 10 is in an OFF-state and stops supplying the power from the power supply Vd to the load 40. Since the delay signal s2 is delayed and also inverted with respect to the control signal CNT, both the control signal CNT and the delay signal s2 are logical high for a period from t1 to t2. Therefore, the discharge control circuit 30 sets the control signal s3 to be logical high and causes the discharge circuit 20 to start the discharging operation.

Right after the control signal CNT becomes logical high, the delay circuit 31 causes a gradual fall in the delay signal s2 from logical high to logical low. At t2, when the voltage level of the signal s2 is below some threshold, the signal s2 is determined to be logical low. Therefore, at the time t1 (at which point the control signal CNT becomes logical high), the logic circuit 32 sets the control signal s3 to be logical high; thereafter, for the period from t1 to t2, the logic circuit 32 keeps the control signal s3 as logical high. Then, at t2, when the delay signal s2 becomes logical low, the logic circuit 32 switches the control signal s3 to be logical low again.

In this way, the discharge control circuit 30 sets the control signal s3 to be logical high when the control signal CNT becomes logical high; thereafter, the discharge control circuit 30 returns the control signal s3 to logical low at t2 after passage of predetermined time from when the control signal CNT became logical high. As a result, after the output circuit 10 stops supplying the power from the power supply Vd, the discharge circuit 20 electrically connects the load 40 to the ground GND and discharges the load 40 for the predetermined period from t1 to t2. After t2, the discharge circuit 20 electrically disconnects the load 40 from the ground GND.

At t3, when the control signal CNT becomes logical low again, the output circuit 10 restarts supplying the power from the power supply Vd to the load 40. At t4, the signal s1 becomes logical high, and after t5, the signal s2 gradually approaches then becomes logical high. The logic circuit 32 keeps the control signal s3 to be logical low during this period. Therefore, the discharge circuit 20 maintains the load 40 as disconnected from the ground GND.

Although not shown, the control signal CNT may subsequently become logical high again and an operation will be performed when the output circuit 10 stops supplying the power from the power supply Vd that is similar to that for the period time from t1 to t2.

In this way, according to the first embodiment, when the control signal CNT becomes logical high and the output circuit 10 stops supplying the power (at, for example, t1), the discharge control circuit 30 sets the control signal s3 to the second logic (for example, to be logical high), so that the discharge circuit 30 starts discharging the load 40. Subsequently, after the passage of the predetermined time since the control signal CNT becomes the second logic (for example, at t2), the discharge control circuit 30 sets the control signal s3 to the first logic (for example, to be logical low), so that the discharge circuit 30 stops discharging the load 40. Discharge time (for example, the period from t1 to t2) can be arbitrarily changed by setting the RC time constant of the delay circuit 31. Therefore, the discharge time may be set to time enough to discharge the load 40, i.e., remove the electric charge accumulated in the load 40.

When the discharge control circuit 30 is not provided, the discharge circuit 20 keeps discharging the load 40 even during the period from t2 to t3. Therefore, an unintended short-circuit current possibly flows from the load 40 to the ground GND via the discharge circuit 20 during this period. There is a possibility that this short-circuit current will cause the breakdown of the load 40. Furthermore, the load 40 is often connected to a power supply of a different semiconductor integrated circuit. In such a case, when the discharge circuit 20 causes a short-circuit between the load 40 and the ground GND, the power supply of the different semiconductor integrated circuit also is short-circuited to the ground GND. In this case, a high short-circuit current also flows through the load 40 and the different semiconductor integrated circuit, possibly resulting in the breakdown of the load 40 and the other semiconductor integrated circuit(s) attached thereto.

To address the problem, the power supply circuit 1 short-circuits the load 40 to the ground GND to discharge the load 40 for the set period of the discharge time and then stops discharging the load 40 after the set period of time. Therefore, the power supply circuit 1 can prevent the discharging of the load 40 from excessively continuing and suppress the breakdown of the load 40 by the current flowing through the discharge circuit 20. The power supply circuit 1 can also serve to suppress the breakdown of other semiconductor integrated circuits connected to the load 40.

Moreover, the discharge control circuit 30 according to the present embodiment is configured with a logic circuit. Therefore, the discharge control circuit 30, as well as the output circuit 10 and the discharge circuit 20, can be easily formed in one semiconductor chip. Furthermore, since the discharge control circuit 30 is configured with the logic circuit, the discharge control circuit 30 can operate to hold down current consumption during a standby state as compared to a circuit having a similar function though configured with an analog circuit. For example, at and after t5 in FIGS. 2A to 2D, when the output circuit 10 starts operating, the discharge control circuit 30 switches into a standby state. The current consumption of the discharge control circuit 30 at this time is relatively low. Moreover, the discharge control circuit 30, which is configured with the digital logic circuit, is superior to an analog circuit in from the standpoint of device size reduction.

Further, the discharge control circuit 30 according to the present embodiment generates the control signal s3 from the control signal CNT and also controls the discharge circuit 20. Therefore, the discharge control circuit 30 can independently control the discharge circuit 20 on the basis of the control signal CNT without dependence on the voltage of the power supply Vd or the output voltage Vout at the first node N1. That is, the discharge time can be determined on the basis of the logic value of the control signal CNT without dependence on analog values, such as the voltage of the power supply Vd and the output voltage Vout at the first node N1. As a consequence, the discharge time can be easily set.

(Second Embodiment)

Figure 3:
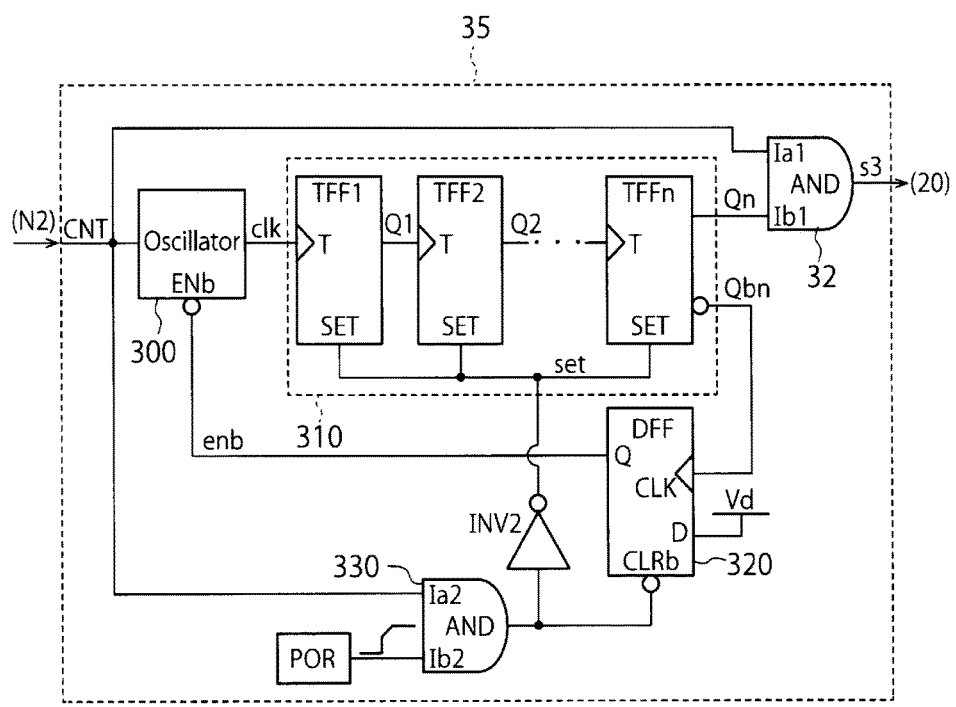
FIG. 3 is a block diagram illustrating an example of a discharge control circuit according to a second embodiment.
Figure 4:
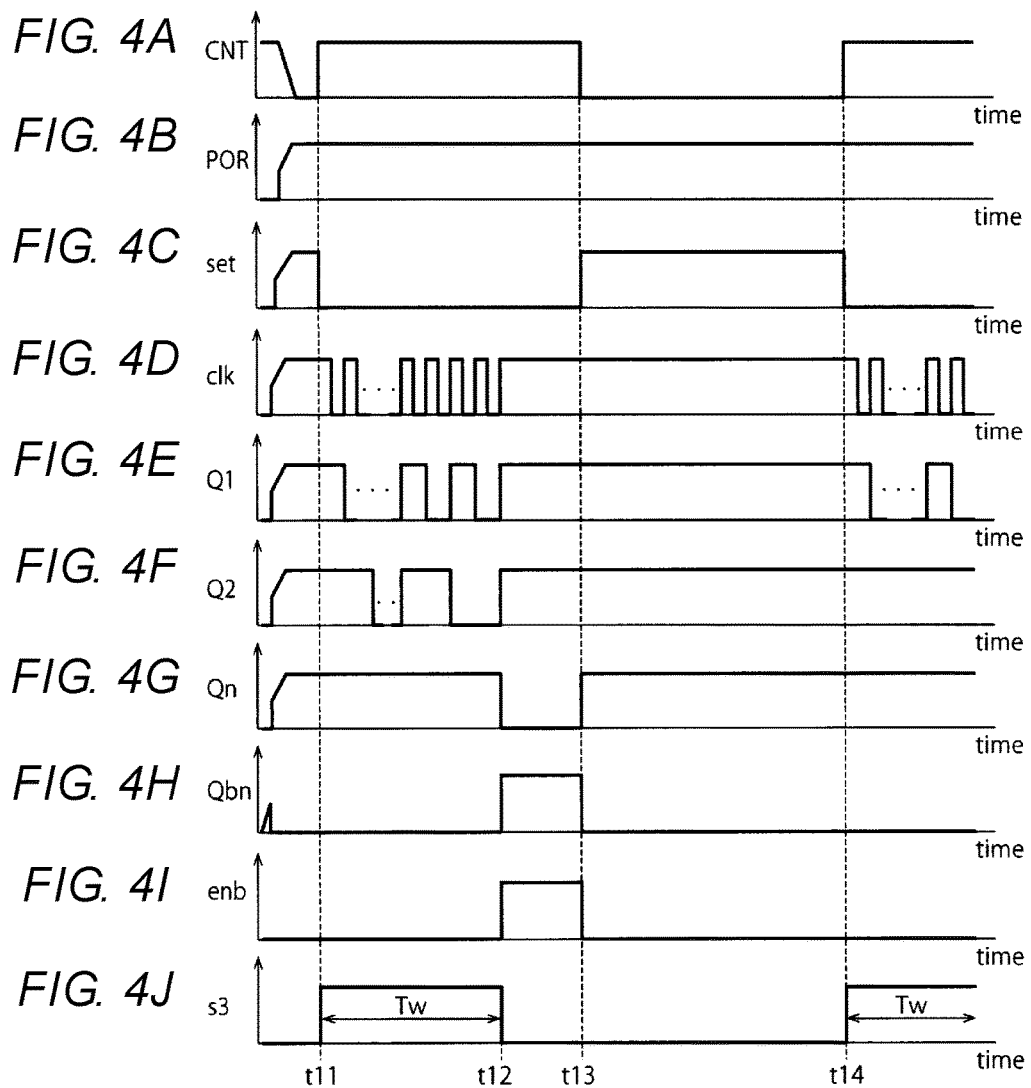
FIGS. 4A to 4J are graphs illustrating an example of an operation performed by the power supply circuit according to the second embodiment.

FIG. 3 is a block diagram illustrating an example of a configuration of a discharge control circuit according to a second embodiment. In general, excepting for the discharge control circuit 30, a power supply circuit 1 according to the second embodiment may be the same a power supply circuit 1 according to the first embodiment.

In the second embodiment, a discharge control circuit 35 is connected between the input node N2 and the gate electrode of the discharge circuit 20 rather than a discharge control circuit 30 (as shown in FIG. 1). The discharge control circuit 35 includes an oscillator 300, a frequency divider circuit 310, a stop circuit 320, the logic circuit 32, a logic circuit 330, and an inverter circuit INV2. The logic circuit 32 may be the same as used in the first embodiment.

The oscillator 300 begins outputting a clock signal clk when the control signal CNT becomes a logical high value. The clock signal clk is a pulse wave with a constant cycle. On the other hand, when the oscillator 300 receives a stop signal enb at an enable terminal ENb at a logical high value, the oscillator 300 stops outputting the clock signal clk.

The frequency divider circuit 310 includes n (where n is a natural number) toggle flip-flop circuits TFF1 to TFFn connected in series between the oscillator 300 and the input terminal Ib1 of the logic circuit 32. The toggle flip-flops TFF1 to TFFn (hereinafter, often referred to simply as "TFF1 to TFFn") divide frequencies of input signals and output frequency-divided signals, respectively. That is, the TFF1 to TFFn multiply cycles of the input signals and output cycle-multiplied signals, respectively.

For example, if the clock signal clk is input from the oscillator to the TFF1, the TFF1 inverts a logic of an output signal Q1 whenever the clock signal clk rises from logical low to logical high. The cycle of the output signal Q1 is thereby made twice as high as the cycle of the clock signal clk. That is, the frequency of the output signal Q1 is made half the frequency of the clock signal clk. Likewise, if the output signal Q1 is input from the TFF1 to the TFF2, the TFF2 inverts a logic of an output signal Q2 whenever the output signal Q1 rises from logical low to logical high. The cycle of the output signal Q2 is thereby made twice as high as the cycle of the output signal Q1 output from the TFF1. That is, the frequency of the output signal Q2 is made half the frequency of the output signal Q1 and made a quarter of the frequency of the clock signal clk. If an output signal Qn-1 is input from the TFFn-1 to the TFFn, the TFFn inverts a logic of an output signal Qn whenever the output signal Qn-1 rises from logical low to logical high. The cycle of the output signal Qn is thereby made twice as high as the cycle of the output signal Qn-1 output from the TFFn-1. That is, the frequency of the output signal Qn is made half the frequency of the output signal Qn-1 and made one 2n-th of the frequency of the clock signal clk.

In this way, the TFF1 to TFFn divide the frequencies of the input signals by two and output the resultant signals, respectively. As a result, the frequency divider circuit 310 divides the frequency of the clock signal clk by 2n and outputs the output signal Qn. A time period after the control signal CNT becomes logical low until the output signal Qn is first inverted from logical high to logical low occurs after passage of predetermined time once the control signal CNT becomes logical low. For this time period, both the control signal CNT and the output signal Qn (corresponding to the delay signal s2 according to the first embodiment) become logical high. Therefore, a period from when the control signal CNT becomes logical high until the logic of the output signal Qn is first inverted corresponds to delay time. For this delay time, the logic circuit 32 sets the control signal s3 to be logical high to keep the discharge circuit 20 in an ON-state. The discharge circuit 20 thereby executes a discharging operation. When the delay time elapses since the control signal CNT becomes logical high, the logic circuit 32 returns the control signal s3 to be logical low to turn off the discharge circuit 20. The discharge circuit 20 thereby stops the discharging operation. In this way, the oscillator 300 and the frequency divider circuit 310 function as a delay circuit that delays the control signal CNT. The delay time can be controlled by changing the number n of the TFF1 to TFFn.

The stop circuit 320 outputs the stop signal enb, stopping the clock signal clk from the oscillator 300, on the basis of the logic of the output signal Qn that serves as the delay signal. The stop circuit 320 is, for example, a D-type flip-flop circuit, receiving an input inversion signal Qbn of the output signal Qn, and raising the stop signal enb to be logical high using the power supply Vd when the inversion signal Qbn becomes logical high. The oscillator 300 receives a feedback of the stop signal enb from the stop circuit 320, and stops outputting the clock signal clk when the stop signal enb becomes logical high. That is, when the output signal Qn becomes logical low, the stop circuit 320 causes the oscillator 300 to stop operating and causes the discharge circuit 20 to stop the discharging operation.

The logic circuit 330 is, for example, an AND gate that performs an AND logical operation. One input terminal Ia2 of the logic circuit 330 is connected to the input node N2 and thus the control signal CNT is input to the input terminal Ia2. The other input terminal Ib2 of the logic circuit 330 is connected to a POR (Power-On-Reset) circuit. The POR circuit generates a POR signal that rises to be a logical high value when the power supply circuit 1 is powered on, and the POR signal is kept logical high while the power supply circuit 1 is activated. Therefore, while the power supply circuit 1 is activated, the logic circuit 330 outputs a signal according to the logic of the control signal CNT. For example, the logic circuit 330 outputs the signal that is logical high when the control signal CNT becomes logical high, and outputs the signal that is logical low when the control signal CNT becomes logical low. An output of the logic circuit 330 is connected to set terminals SET of the TFF1 to TFFn via the inverter circuit INV2 and connected to a clear terminal CLRb of the stop circuit 320. When a set signal (label "set" in FIG. 3) is activated to be logical high, the TFF1 to TFFn turn into set states. In the set states, the TFF1 to TFFn output the output signals Q1 to Qn that are all logical high. Furthermore, when a signal to the clear terminal CLRb of the stop circuit 320 is logical low, the stop circuit 320 releases the stop signal enb from the power supply Vd to set the stop signal enb to be logical low. Activating a set signal means setting a logic of the set signal so that the TFF1 to TFFn enter set states. Deactivating the set signal means setting the logic of the set signal so that the set states of the TFF1 to TFFn are cancelled. Activating the signal to the clear terminal CLRb means setting a logic of the signal so that the stop circuit 320 is reset to an initial state. Deactivating the signal to the clear terminal CLRb means setting the logic of the signal so that the initial state of the stop circuit 320 is cancelled.

When the control signal CNT is logical low and the discharge circuit 20 stops the discharging operation, the oscillator 300 does not operate and does not output the clock signal clk. Further, the logical low 330 outputs the signal that is logical low. The set signal thereby becomes logical high to make the TFF1 to TFFn enter into the set states. While the output signal Qn input to the input terminal Ib1 of the logic circuit 32 is logical high, the control signal CNT input to the input terminal Ia1 thereof is logical low; therefore, the logic circuit 32 keeps the control signal s3 logical low, so that the discharge circuit 20 does not execute the discharging operation.

Right after the control signal CNT becomes logical high, the oscillator 300 is activated to output the clock signal clk. Furthermore, the logic circuit 330 outputs a signal that is logical high, so that the set states of the TFF1 to TFFn are cancelled. Therefore, the TFF1 to TFFn receive the clock signals and divide the frequencies of the clock signals, respectively. During the delay time before the last output signal Qn of the frequency divider circuit 310 is inverted from logical high to logical low, the logic circuit 32 outputs a control signal s3 that is logical high. The discharge control circuit 35 thereby turns on the discharge circuit 20 so that the discharge circuit 20 executes the discharging operation right after the output circuit 10 stops supplying the power to the load 40.

After passage of the delay time after the control signal CNT becomes logical high, when the output signal Qn is inverted first from logical high to logical low, the logic circuit 32 sets control signal s3 to be logical low. The discharge control circuit 35 thereby turns off the discharge circuit 20, so that the discharge circuit 20 stops the discharging operation. Additionally, when the inversion signal Qbn of the output signal Qn is inverted from logical low to logical high, the stop circuit 320 activates the stop signal enb to be logical high to cause the oscillator 300 to stop operating. The oscillator 300 thereby stops outputting the clock clk and the TFF1 to TFFn stop operating. It is assumed that the oscillator 300 is stopped when the stop signal enb is logical high and that a stopped state of the oscillator 300 is cancelled when the stop signal enb is logical low.

Subsequently, when the control signal CNT becomes logical low for supplying the power, then the set signal is activated to be logical high and the TFF1 to TFFn turn into the set states again.

In this way, similarly to the first embodiment, the power supply circuit 1 according to the second embodiment discharges the load 40 until the passage of the delay time since the output circuit 10 stops supplying the power to the load 40 and then stops discharging the load 40. The second embodiment can thereby exhibit the same advantages as those of the first embodiment. Furthermore, in the second embodiment, when the output signal Qn becomes logical low, the stop circuit 320 causes the oscillator 300 to stop operating and causes the discharge circuit 20 to stop the discharging operation. Therefore, when the discharge circuit 20 does not execute the discharging operation, the current consumption of the discharge control circuit 35 can be suppressed to be substantially zero.

An operation performed by the power supply circuit 1 according to the second embodiment will next be described.

FIGS. 4A to 4J are graphs illustrating an example of the operation performed by the power supply circuit 1 according to the second embodiment. FIGS. 4A to 4J illustrate actions of the control signal CNT, the POR signal, the set signal, the clock signal clk, the output signals Q1, Q2, and Qn, the inversion signal Qbn, the stop signal enb, and the control signal s3, respectively. It is noted that graphs of the output signals Q3 to Qn-1 are omitted.

First, when the power supply circuit 1 is actuated, the POR signal from the POR circuit rises to be logical high. Subsequently, prior to t11, the control signal CNT becomes, for example, logical low and the output circuit 10 supplies the power from the power supply Vd to the load 40. At this time, the set signal is logical high and the TFF1 to TFFn are in the set states. Therefore, the output signals Q1 to Qn are set to be logical high. At this time, the inversion signal Qbn is logical low, so that the stop signal enb is deactivated to be logical low. Furthermore, the control signal CNT is logical low, so that the logic circuit 32 outputs the control signal s3 that is logical low. Therefore, the discharge circuit 20 is in an OFF-state and electrically disconnects the load 40 from the ground GND.

At t11, when the control signal CNT becomes logical high, the output circuit 10 stops supplying the power from the power supply Vd. Meanwhile, the discharge control circuit 35 sets the control signal s3 to be logical high, so that the discharge circuit 20 starts the discharging operation. Here, right after the control signal CNT becomes logical high, the output signal Qn is kept at a logical high value as described above. The logic circuit 32, therefore, sets the control signal s3 to be logical high, so that the discharge circuit 20 starts the discharging operation. Furthermore, when the control signal CNT becomes logical high, the oscillator 300 starts outputting the clock signal clk. Moreover, the set signal becomes logical low, so that the frequency divider circuit 310 is made operable. The frequency divider circuit 310 thereby starts a frequency division operation for dividing the frequency of the clock signal clk.

When the frequency divider circuit 310 executes the frequency division operation and the output signal Qn is inverted first from logical high to logical low at t12, the logic circuit 32 lowers the control signal s3 to be logical low to cause the discharge circuit 20 to stop the discharging operation. At this time, the inversion signal Qbn rises from logical low to logical high and the stop circuit 320 sets the stop signal enb to be logical high. As a result, at and after t12, the oscillator 300 stops outputting the clock signal clk.

In this way, the discharge control circuit 35 sets the control signal s3 to be logical high when the control signal CNT becomes logical high; thereafter, the discharge control circuit 35 returns the control signal s3 to be logical low at t12 after passage of a predetermined time after the control signal CNT becomes logical high. As a result, after the output circuit 10 stops supplying the power from the power supply Vd, the discharge circuit 20 electrically connects the load 40 to the ground GND and discharges the load 40, i.e., removes electric charge from the load 40 for the predetermined period from t11 to t12. At t12, the discharge circuit 20 electrically disconnects the load 40 from the ground GND and ends the short-circuit current from flowing from the load 40 to the ground GND.

At t13, when the control signal CNT becomes logical low, the output circuit 10 restarts supplying the power from the power supply Vd to the load 40. At this time, the set signal becomes logical high to set the output signals Q1 to Qn of the TFF1 to TFFn to be logical high. Furthermore, the inversion signal Qbn becomes logical low, so that the stop signal enb returns to be logical low.

Subsequently, at t14, the control signal CNT becomes logical high and an operation performed when the output circuit 10 stops supplying the power from the power supply Vd is similar to that for the period time from t11 to t12.

In this way, according to the second embodiment, when the control signal CNT becomes logical high and the output circuit 10 stops supplying the power (at, for example, t11), the discharge control circuit 35 sets the control signal s3 to be logical high, so that the discharge circuit 35 starts discharging the load 40. Subsequently, after the passage of the predetermined time since the control signal CNT becomes logical high (for example, at t12), the discharge control circuit 35 sets the control signal s3 to be logical low, so that the discharge circuit 35 stops discharging the load 40. Therefore, the second embodiment can exhibit the same advantages as those of the first embodiment. Furthermore, in the second embodiment, when the output signal Qn becomes logical low, the stop circuit 320 causes the oscillator 300 to stop operating and causes the discharge circuit 20 to stop the discharging operation. Therefore, when the discharge circuit 20 does not execute the discharging operation, the current consumption of the discharge control circuit 35 can be suppressed to be substantially zero. It is noted that the discharge time (for example, the period from t11 to t12) can be arbitrarily changed by changing the number n of the TFF1 to TFFn. Therefore, the discharge time can be set to be a time long enough to discharge the load 40.

(Third Embodiment)

Figure 5:
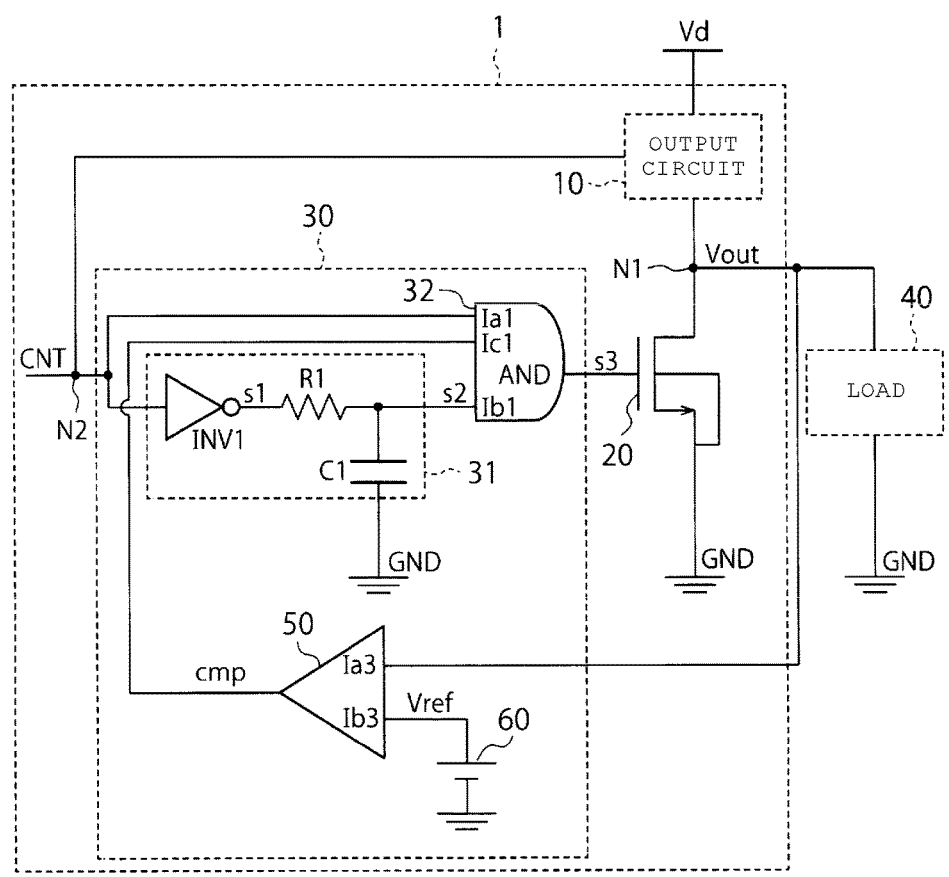
FIG. 5 is a block diagram illustrating an example of a discharge control circuit according to a third embodiment.

FIG. 5 is a block diagram illustrating an example of a configuration of a discharge control circuit according to a third embodiment. The discharge control circuit 30 according to the third embodiment further includes a comparison circuit 50 as a comparison unit. The comparison circuit 50 is connected between the first node N1 and the discharge control circuit 30. An input terminal Ia3 of the comparison circuit 50 is connected to the first node N1 and an input terminal Ib3 thereof is connected to a voltage source 60. The voltage source 60 generates a reference voltage Vref and applies the reference voltage Vref to the input terminal Ib3.

The comparison circuit 50 compares the output voltage Vout of the first node N1 to a reference voltage Vref and outputs a comparison result cmp. For example, when the output circuit 10 supplies the power to the load 40, the output voltage Vout of the first node N1 can be judged to be higher than the reference voltage Vref by operation of the comparison circuit 50, and comparison circuit 50 outputs a comparison result cmp that is logical high when output voltage Vout is higher than the reference voltage Vref. On the other hand, when the output circuit 10 stops supplying power and the discharge circuit 20 discharges the load 40, the output voltage Vout of the first node N1 gradually falls and eventually become lower than the reference voltage Vref. At this time, the comparison circuit 50 inverts the comparison result cmp from logical high to logical low.

An output terminal of the comparison circuit 50 is connected to one input terminal Ic1 of the logic circuit 32. The logic circuit 32 has three input terminals (Ia1, Ib1, and Ic1), and the first control signal CNT, the delay signal s2, and the comparison result cmp are input to the input terminals Ia1, Ib1, and Ic1, respectively. The logic circuit 32 executes an AND operation on input the first control signal CNT, the delay signal s2, and the comparison result cmp. The logic circuit 32 outputs the second control signal s3 according to the logic operation on the input signals. Therefore, the discharge control circuit 30 sets the second control signal s3 to be logical high and causes the discharge circuit 20 to execute the discharging operation after the first control signal CNT becomes logical high to start the discharging operation until the delay signal s2 becomes logical low or until the comparison result cmp becomes logical low. When either the delay signal s2 or the comparison result cmp becomes logical low, the discharge control circuit 30 sets the second control signal s3 to be logical low, which causes the discharge circuit 20 to stop the discharging operation.

For example, during the discharging operation, even if the output voltage Vout is higher than the reference voltage Vref, the discharge control circuit 30 sets the control signal s3 to be logical low when the delay time elapses and the delay signal s2 becomes logical low. Furthermore, during the discharging operation, even if the delay time has not elapsed, the discharge control circuit 30 sets the control signal s3 to be logical low when the output voltage Vout becomes lower than the reference voltage Vref and the comparison result cmp becomes logical low. In this way, in the third embodiment, the timing at which the discharge circuit 20 stops the discharging operation is determined using both the delay time from the delay circuit 31 and a voltage level of the output voltage Vout. In other words, both the delay circuit 31 and the comparison circuit 50 function as a delay circuit.

Other elements according to the third embodiment may be the same in configuration as the corresponding elements according to the first embodiment.

Figure 6:
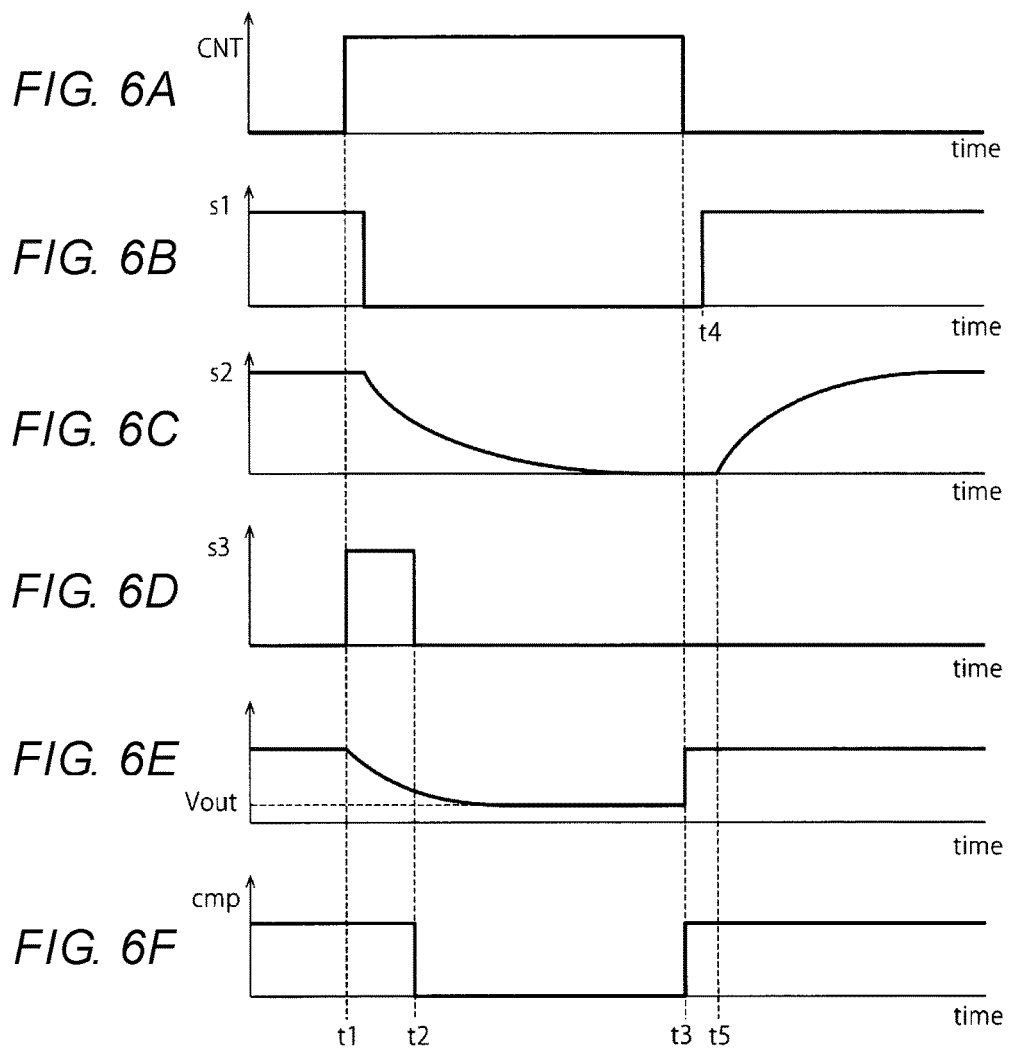
FIGS. 6A to 6F are graphs illustrating an example of an operation performed by the power supply circuit according to the third embodiment.

FIGS. 6A to 6F are graphs illustrating an example of an operation performed by the power supply circuit 1 according to the third embodiment. FIGS. 6A to 6D correspond, in general, to FIGS. 2A to 2D, respectively. Therefore, FIGS. 6A to 6D are not described in detail. FIG. 6E illustrates an action of the output voltage Vout and FIG. 6F illustrates an action of the comparison result cmp.

First, prior to t1, the control signal CNT is logical low and the output circuit 10 supplies the power from the power supply Vd to the load 40. At this time, the output voltage Vout is a high-level voltage. The signal s2 and the comparison result cmp that are logical high are output. However, the control signal CNT is logical low, so that the logic circuit 32 outputs the control signal s3 that is logical low. Therefore, the discharge circuit 20 is in an OFF-state and electrically disconnects the load 40 from the ground GND.

At t1, when the control signal CNT becomes logical high, the output circuit 10 is in an OFF-state and stops supplying the power from the power supply Vd to the load 40. On the other hand, right after t1, the control signal CNT, the delay signal s2, and the comparison result cmp become logical high. This is because right after t1, voltage levels of the delay signal s2 and the comparison result cmp gradually fall by the delay circuit 31 and the comparison circuit 50, and are kept logical high for a predetermined period. Therefore, at t1, the discharge control circuit 30 sets the control signal s3 to be logical high to cause the discharge circuit 20 to start the discharging operation.

Here, right after the control signal CNT becomes logical high, the delay circuit 31 causes an analog and gradual fall in the delay signal s2 from logical high to logical low. Furthermore, the discharging operation causes an analog and gradual fall in the output voltage Vout.

If timing at which the output voltage Vout becomes lower than the reference voltage Vref is earlier than timing at which the voltage level of the delay signal s2 becomes lower than a threshold Vth, then the comparison result cmp becomes logical low and the logic circuit 32 inverts the control signal s3 to be logical low again at the timing at which the output voltage Vout becomes lower than the reference voltage Vref. As a result, the discharging operation ends.

If the timing at which the voltage level of the delay signal s2 becomes lower than the threshold Vth is earlier than the timing at which the output voltage Vout becomes lower than the reference voltage Vref, then the delay signal s2 becomes logical low and the logic circuit 32 inverts the control signal s3 to be logical low again at the timing at which the voltage level of the delay signal s2 becomes lower than the threshold Vth. As a result, the discharging operation ends.

In this way, the discharge control circuit 30 controls the discharge circuit 20 to start the discharging operation when the control signal CNT becomes logical high, and then controls the discharge circuit 20 to stop the discharging operation when either the comparison result cmp or the delay signal s2 becomes logical high. That is, after the output circuit 10 stops supplying the power from the power supply Vd, the discharge circuit 20 electrically connects the load 40 to the ground GND and discharges the load 40 for a certain period (for example, a period from t1 to t2). Subsequently, the discharge circuit 20 electrically disconnects the load 40 from the ground GND.

At t3, when the control signal CNT becomes logical low and the output circuit 10 starts supplying the power from the power supply Vd, the output voltage Vout rises to be the high-level voltage and a comparison result cmp that is logical high is output.

In this way, in the third embodiment, the timing at which the discharge circuit 20 stops the discharging operation is determined using not only the delay time of the delay circuit 31 but also the voltage level of the output voltage Vout. Monitoring the output voltage Vout enables detection of a discharged state of the load 40. Therefore, even before passage of the delay time of the delay circuit 31, the discharge control circuit 30 can set the control signal s3 to be logical low and cause the discharge circuit 20 to stop the discharging operation once the voltage level of the output voltage Vout is lower than the reference voltage Vref and the load 40 is deemed sufficiently discharged. The power supply circuit 1 can thereby stop the discharging operation for discharging the load 40 at more efficient timing. Moreover, the third embodiment can exhibit the advantages of the first embodiment.

(Fourth Embodiment)

Figure 7:
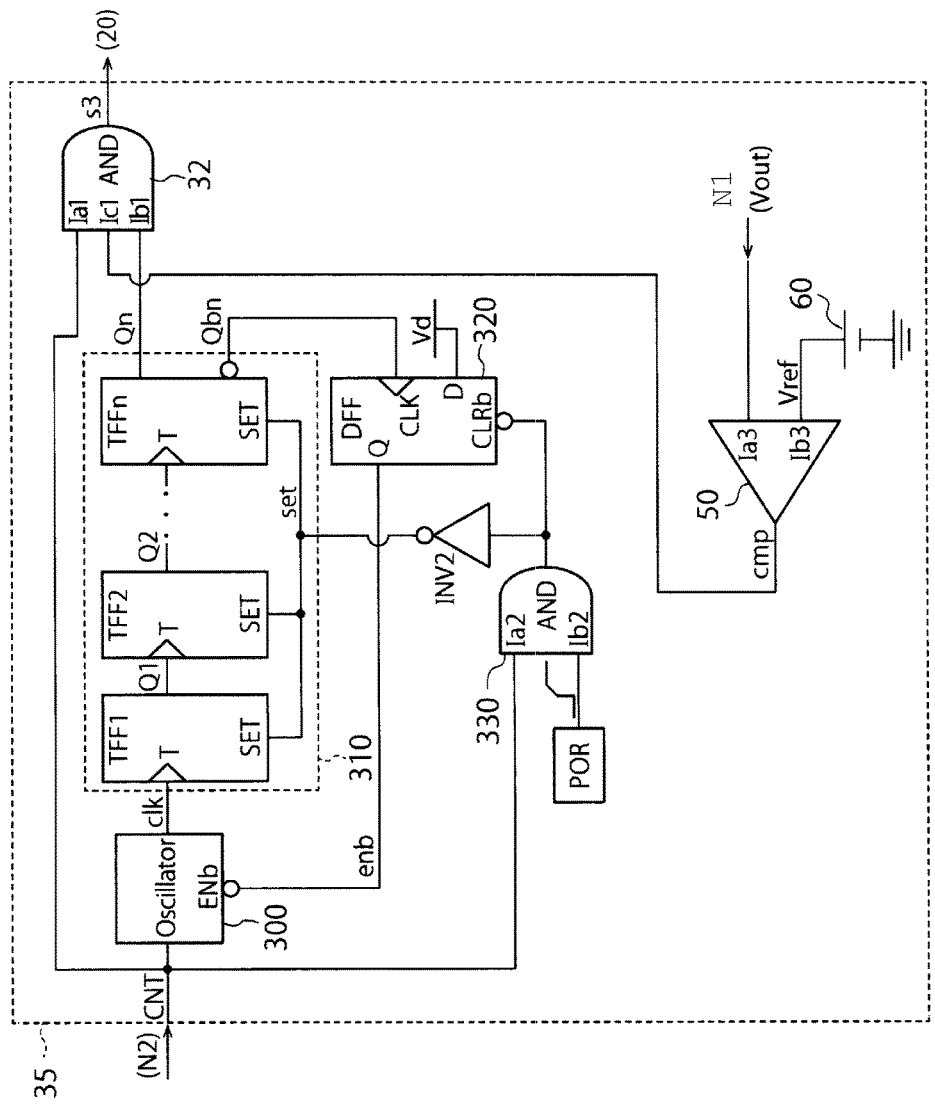
FIG. 7 is a block diagram illustrating an example of a discharge control circuit according to a fourth embodiment.

FIG. 7 is a block diagram illustrating an example of a configuration of a discharge control circuit according to a fourth embodiment. In the fourth embodiment, the comparison circuit 50 is applied to the discharge control circuit 35 according to the second embodiment.

The input terminal Ia3 of the comparison circuit 50 is connected to the first node N1 and the input terminal Ib3 thereof is connected to the voltage source 60. The output terminal of the comparison circuit 50 is connected to one input terminal Ic1 of the logic circuit 32. The logic circuit 32 has the three input terminals Ia1, Ib1, and Ic1, and the first control signal CNT, the output signal Qn, and the comparison result cmp are input to the input terminals Ia1, Ib1, and Ic1, respectively. The logic circuit 32 executes an AND operation on the first control signal CNT, the output signal Qn, and the comparison result cmp. The logic circuit 32 outputs a logical operation result as the second control signal s3. Therefore, the discharge control circuit 35 sets the second control signal s3 to be logical high to cause the discharge circuit 20 to execute the discharging operation when the first control signal CNT becomes logical high to start the discharging operation until the output signal Qn becomes logical low or until the comparison result cmp becomes logical low. When either the output signal Qn or the comparison result cmp becomes logical low, the discharge control circuit 35 sets the second control signal s3 to be logical low to cause the discharge circuit 20 to stop the discharging operation.

For example, during the discharging operation, even if the output voltage Vout is higher than the reference voltage Vref, the discharge control circuit 35 sets the control signal s3 to be logical low to cause the discharge circuit 20 to stop the discharging operation once the delay time elapses and the output signal Qn becomes logical low. Furthermore, during the discharging operation, even if the delay time has not elapsed, the discharge control circuit 30 sets the control signal s3 to be logical low to cause the discharge circuit 20 to stop the discharging operation once the output voltage Vout becomes lower than the reference voltage Vref and the comparison result cmp becomes logical low. In this way, in the fourth embodiment, the end timing at which the discharge circuit 20 stops the discharging operation is determined using both the delay time of the frequency divider circuit 310 and the voltage level of the output voltage Vout. In other words, both the frequency divider circuit 310 and the comparison circuit 50 function as a delay circuit.

Other elements according to the fourth embodiment may be the same in configuration as the corresponding elements according to the second embodiment. An operation performed by the power supply circuit 1 according to the fourth embodiment can be understood by referring to FIGS. 4A to 4J and FIGS. 6E and 6F. Therefore, the operation of this embodiment is not described in detail.

In the fourth embodiment, the end timing at which the discharge circuit 20 stops the discharging operation is determined using not only the delay time of the frequency divider circuit 310 but also the voltage level of the output voltage Vout. Monitoring the output voltage Vout enables detection of the discharged state of the load 40. Therefore, the fourth embodiment can exhibit the advantages of the second and third embodiments.

(Fifth Embodiment)

Figure 8:
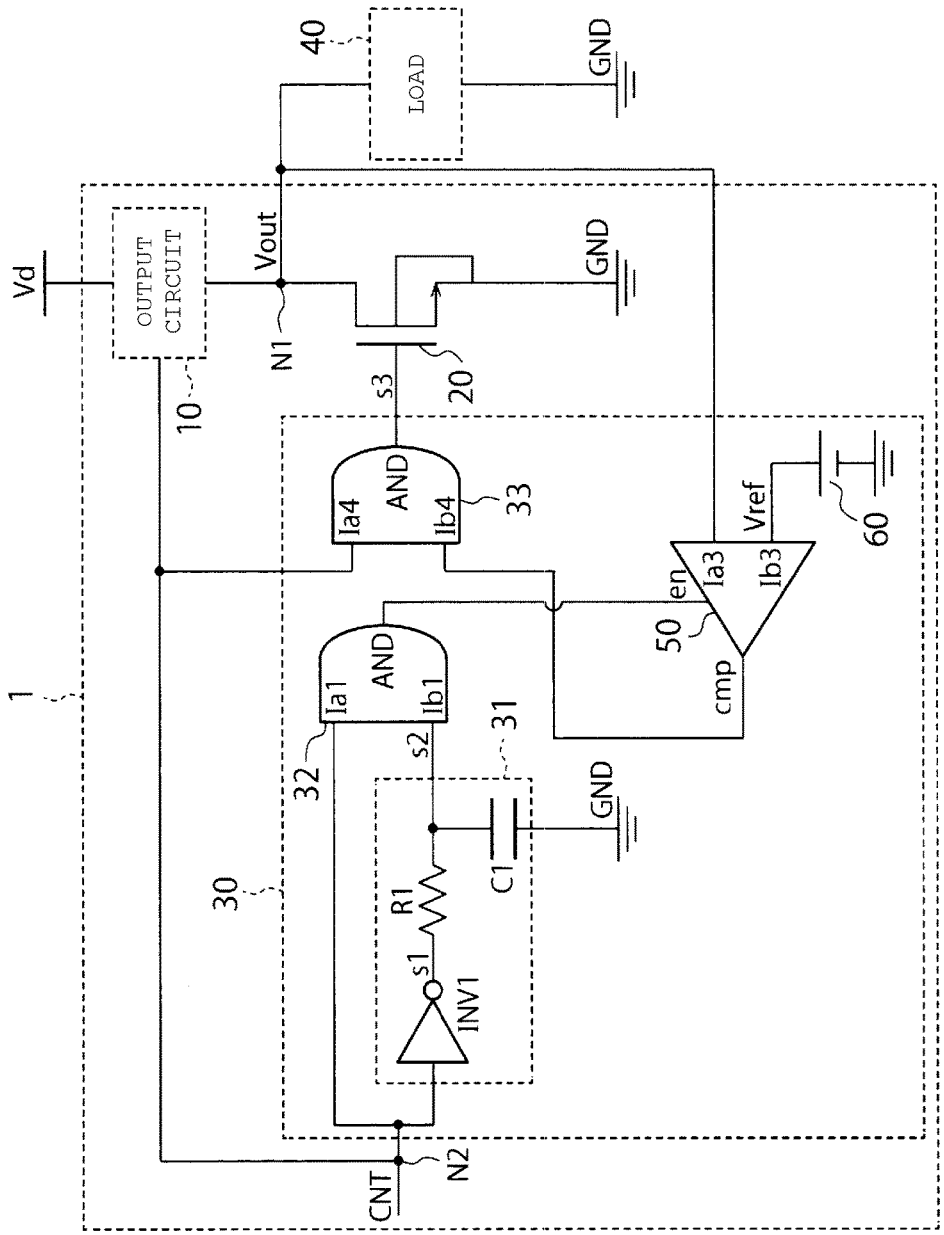
FIG. 8 is a block diagram illustrating an example of a discharge control circuit according to a fifth embodiment.

FIG. 8 is a block diagram illustrating an example of a configuration of a discharge control circuit according to a fifth embodiment. The discharge control circuit 30 according to the fifth embodiment further includes a logic circuit 33. The logic circuit 33 is, for example, an AND gate that performs an AND operation. An input terminal Ia4 of the logic circuit 33 receives the control signal CNT and an input terminal Ib4 thereof receives the comparison result cmp of the comparison circuit 50. The logic circuit 33 performs a logical operation on the control signal CNT and the comparison result cmp and outputs a logical operation result as the control signal s3. For example, the logic circuit 33 outputs a logical AND operation on the control signal CNT and the comparison result cmp to provide the control signal s3. The control signal s3 exerts a switching control on the discharge circuit 20.

The logic circuit 32 is substantially identical in configuration and operation to that according to the first embodiment. The comparison circuit 50 is substantially identical in configuration and operation to that according to the third embodiment. However, in this fifth embodiment, an output of the logic circuit 32 is connected to a power supply of the comparison circuit 50, and an enable signal en, output from the logic circuit 32, is used as the power supply of the comparison circuit 50. The comparison circuit 50 receives the enable signal en from the logic circuit 32 and executes a comparison operation. Furthermore, an output of the comparison circuit 50 is connected to the input terminal Ib4 of the logic circuit 33 so as to output the comparison result cmp to the logic circuit 33.

Other elements according to the fifth embodiment may be the same in configuration as the corresponding elements according to the third embodiment.

Figure 9A:
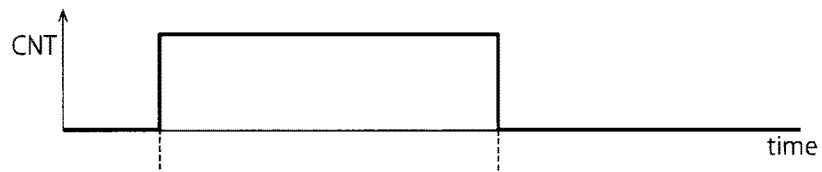
FIGS. 9A to 9G are graphs illustrating an example of an operation performed by the power supply circuit according to the fifth embodiment.
Figure 9B:
Figure 9C:
Figure 9D:
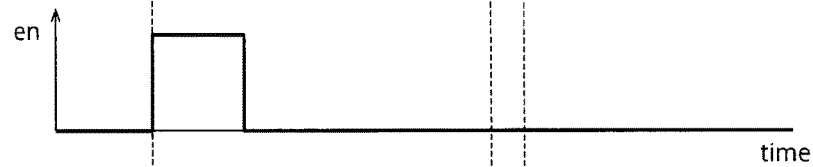
Figure 9E:
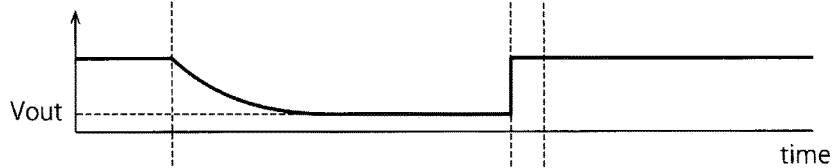
Figure 9F:
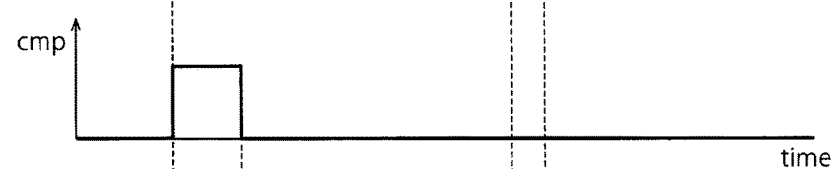
Figure 9G:

FIGS. 9A to 9G are graphs illustrating an example of an operation performed by the power supply circuit 1 according to the fifth embodiment. FIGS. 9A to 9C and FIG. 9E correspond, in general, to FIGS. 6A to 6C and FIG. 6E, respectively. FIG. 9D illustrates an action of the enable signal en output from the logic circuit 32. FIG. 9G illustrates an action of the control signal s3 output from the logic circuit 33. The comparison circuit 50 is driven when the enable signal en is logical high and not driven when the enable signal is logical low. Therefore, the comparison result cmp shown in FIG. 9F could become logical high when the enable signal en is logical high. The comparison result cmp is always logical low when the enable signal en is logical low.

In the fifth embodiment, similarly to the third embodiment, the timing at which the discharge circuit 20 stops the discharging operation is determined using both the delay time of the delay circuit 31 and the voltage level of the output voltage Vout. That is, the discharge control circuit 30 causes the discharge circuit 20 to stop the discharging operation when either the enable signal en or the comparison result cmp becomes a logical low value. For example, during the discharging operation, even if the output voltage Vout is higher than the reference voltage Vref, the comparison circuit 50 sets the comparison result cmp to be logical low when the delay time elapses and the enable signal en becomes logical low. Therefore, the logic circuit 33 sets the control signal s3 to be logical low, so that the discharge circuit 20 stops the discharging operation. Furthermore, during the discharging operation, even if the delay time has not elapsed, the discharge control circuit 30 sets the control signal s3 to be logical low when the output voltage Vout becomes lower than the reference voltage Vref and the comparison result cmp becomes logical low.

In the example shown in FIGS. 9A to 9G, the comparison result cmp becomes logical low earlier than the enable signal en. This signifies that during the discharging operation, the output voltage Vout becomes lower than the reference voltage Vref before the delay time elapses. In such a case, when the comparison result cmp becomes logical low, the discharge control circuit 30 sets the control signal s3 to be logical low to cause the discharge circuit 20 to stop the discharging operation.

As described so far, the power supply circuit 1 according to the fifth embodiment can operate similarly to the power supply circuit 1 according to the third embodiment. The fifth embodiment can thereby exhibit the same advantages as those of the third embodiment.

Furthermore, in the fifth embodiment, when the delay time elapses during the discharging operation, then the enable signal en becomes logical low, and supply of the power to the comparison circuit 50 is stopped. Therefore, it is possible to save current consumption after the end of the discharging operation.

(Sixth Embodiment)

Figure 10:
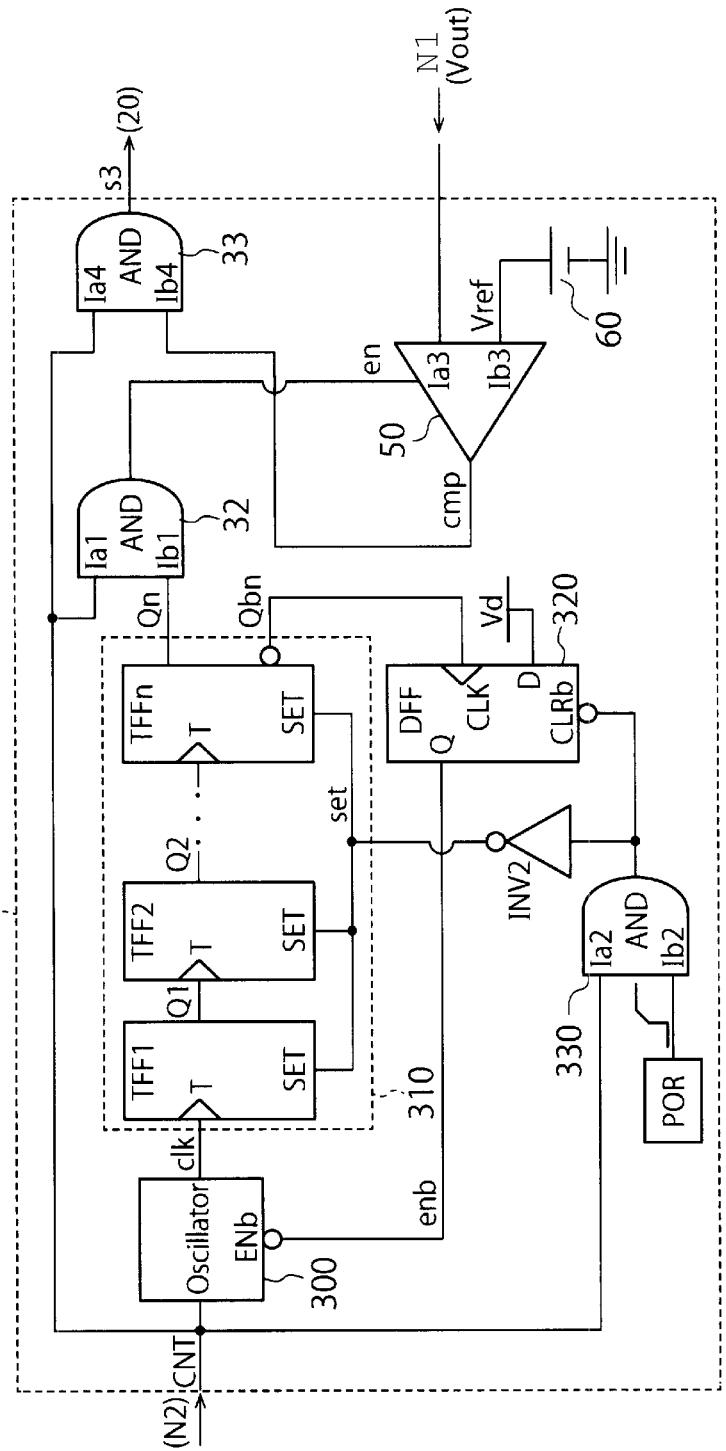
FIG. 10 is a block diagram illustrating an example of a discharge control circuit according to a sixth embodiment.

FIG. 10 is a block diagram illustrating an example of a configuration of a discharge control circuit according to a sixth embodiment. In the sixth embodiment, the logic circuit 33 is applied to the discharge control circuit 35 according to the fourth embodiment.

A connection relationship among the logic circuits 32 and 33 and the comparison circuit 50 in the sixth embodiment is the same as a connection relationship among the logic circuits 32 and 33 and the comparison circuit 50 in the fifth embodiment. Other elements may be the same in configuration as the corresponding elements according to the fourth embodiment.

Furthermore, an operation according to the sixth embodiment can be understood from the operation according to the fifth embodiment and the operation according to the second embodiment. In the sixth embodiment, similarly to the fourth embodiment, the timing at which the discharge circuit 20 stops the discharging operation is determined using both the delay time of the delay circuit 31 and the voltage level of the output voltage Vout. That is, the discharge control circuit 35 causes the discharge circuit 20 to stop the discharging operation when either the enable signal en or the comparison result cmp becomes logical low. Therefore, the power supply circuit 1 according to the sixth embodiment can operate similarly to the power supply circuit 1 according to the fourth embodiment. The sixth embodiment can thereby exhibit the same advantages as those of the fourth embodiment.

Moreover, in the sixth embodiment, similarly to the fifth embodiment, when the delay time elapses during the discharging operation, then the enable signal en becomes logical low, and the supply of the power to the comparison circuit 50 is stopped. Therefore, it is possible to save current consumption after the end of the discharging operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. The accompanying claims and their equivalents are intended to cover such forms or modifications as would fall within the scope and spirit of the inventions.

What is claimed is:

1. A semiconductor integrated circuit, comprising:
an output circuit connected between a power supply and a first node at which a load component can be connected, the output circuit electrically connecting the power supply to the first node when a first control signal supplied to the output circuit is a first logic level and electrically disconnecting the power supply from the first node when the first control signal is a second logic level;
a discharge circuit connected between the first node and a reference potential source, the discharge circuit electrically disconnecting the first node from the reference potential source when a second control signal supplied to the discharge circuit is the first logic level and electrically connecting the first node to the reference potential source when the second control signal is the second logic level; and
a discharge control circuit configured to set the second control signal to the second logic level when the first control signal changes to the second logic level from the first logic level and to set the second control signal to the first logic level after a predetermined time has elapsed from a time when the first control signal changes to the second logic level, wherein
the discharge control circuit includes:
a delay circuit receiving the first control signal as an input and generating a delay signal by delaying a signal corresponding to the first control signal; and
a first logic circuit configured to perform a logical operation on at least the first control signal and the delay signal and to output a logical operation result as the second control signal.

2. The semiconductor integrated circuit according to claim 1, wherein
the delay circuit includes a resistance element and a capacitor element, and
the logical operation performed by the first logic circuit is a logical AND operation with only the first control signal and the delay signal as inputs to the first logic circuit.

3. The semiconductor integrated circuit according to claim 1, wherein the delay circuit includes:
an oscillator outputting a clock signal when the first control signal becomes the second logic level; and
a frequency divider circuit configured to divide a frequency of the clock signal and provide the delay signal.

4. The semiconductor integrated circuit according to claim 3, wherein the delay circuit further includes:
a stop circuit configured to supply a signal to stop the clock signal from being output from the oscillator according a logic level of the delay signal.

5. The semiconductor integrated circuit according to claim 4, further comprising:
a comparison circuit having a first input connected to the first node and a second input connected to a reference voltage source, the comparison circuit configured to compare a voltage at the first node to a reference voltage from the reference voltage source and to output a comparison result according to the comparison of the voltage at the first node to the reference voltage, wherein
the comparison result is supplied to the discharge control circuit and the discharge control circuit is further configured to set the second control signal to the first logic level when either the predetermined time elapses after the first control signal becomes the second logic level or when the comparison result is the second logic level.

6. The semiconductor integrated circuit according to claim 5, wherein the first logic circuit performs the logical AND operation with the first control signal, the delay signal, and the comparison result as inputs.

7. The semiconductor integrated circuit according to claim 1, wherein the output circuit, the discharge circuit, and the discharge control circuit are, collectively, disposed on one semiconductor chip.

8. A semiconductor integrated circuit, comprising:
an output circuit connected between a power supply and a first node at which a load component can be connected, the output circuit electrically connecting the power supply to the first node when a first control signal supplied to the output circuit is a first logic level and electrically disconnecting the power supply from the first node when the first control signal is a second logic level;
a discharge circuit connected between the first node and a reference potential source, the discharge circuit electrically disconnecting the first node from the reference potential source when a second control signal supplied to the discharge circuit is the first logic level and electrically connecting the first node to the reference potential source when the second control signal is the second logic level; and
a discharge control circuit configured to set the second control signal to the second logic level when the first control signal changes to the second logic level from the first logic level and to set the second control signal to the first logic level after a predetermined time has elapsed from a time when the first control signal changes to the second logic level, wherein
the discharge circuit includes:
a delay circuit receiving the first control signal as an input and generating a delay signal by delaying a signal corresponding to the first control signal;
a first logic circuit configured to perform a logical operation on at least the first control signal and the delay signal and to output a first logical operation result signal;
a comparator having a first input connected to the first node and a second input connected to a reference voltage source, the comparator configured to compare a voltage at the first node to a reference voltage from the reference voltage source and to output a comparison result according to the comparison of the voltage at the first node to the reference voltage;
a second logic circuit configured to perform a logical AND operation with the first control signal and the comparison result and output the second control signal according to the logical AND operation, wherein
an output of the first logic circuit is supplied to power the comparator.

9. A semiconductor integrated circuit, comprising:
an output circuit connected between a power supply and a first node at which a load component can be connected, the output circuit electrically connecting the power supply to the first node when a first control signal supplied to the output circuit is a first logic level and electrically disconnecting the power supply from the first node when the first control signal is a second logic level;
a discharge circuit connected between the first node and a reference potential source, the discharge circuit electrically disconnecting the first node from the reference potential source when a second control signal supplied to the discharge circuit is the first logic level and electrically connecting the first node to the reference potential source when the second control signal is the second logic level; and
a discharge control circuit configured to set the second control signal to the second logic level when the first control signal changes to the second logic level from the first logic level and to set the second control signal to the first logic level after a predetermined time has elapsed from a time when the first control signal changes to the second logic level, wherein
the discharge control circuit includes:
a delay circuit receiving the first control signal as an input and generating a delay signal by delaying a signal corresponding to the first control signal; and
a first logic circuit configured to perform a logical operation on at least the first control signal and the delay signal and to output a logical operation result as the second control signal;
a stop circuit configured to supply a signal to stop the clock signal from being output from the oscillator according a logic level of the delay signal received by the delay circuit;
a comparator having a first input connected to the first node and a second input connected to a reference voltage source, the comparator configured to compare a voltage at the first node to a reference voltage from the reference voltage source and to output a comparison result according to the comparison of the voltage at the first node to the reference voltage; and
a second logic circuit configured to perform a logical AND operation with the first control signal and a power-on-reset signal as inputs and to output the second control signal according to the logical AND operation as an inverted set signal to the delay circuit, wherein
the delay circuit includes:
an oscillator outputting a clock signal when the first control signal becomes the second logic level; and
a frequency divider circuit configured to divide a frequency of the clock signal to provide the delay signal.

10. The semiconductor integrated circuit according to claim 1, wherein the discharge circuit is a switch that opens and closes according to a level of the second control signal.

11. The semiconductor integrated circuit according to claim 8, wherein the output circuit, the discharge circuit, and the discharge control circuit are, collectively, disposed on one semiconductor chip.

12. The semiconductor integrated circuit according to claim 9, wherein the output circuit, the discharge circuit, and the discharge control circuit are, collectively, disposed on one semiconductor chip.

* * * * *